United States Patent [19]

Schwarzbauer

[11] Patent Number: 4,810,672
[45] Date of Patent: Mar. 7, 1989

[54] METHOD OF SECURING ELECTRONIC COMPONENTS TO A SUBSTRATE

[75] Inventor: Herbert Schwarzbauer, Munich, Fed. Rep. of Germany

[73] Assignee: Siemens Aktiengesellschaft, Berlin and Munich, Fed. Rep. of Germany

[21] Appl. No.: 29,819

[22] Filed: Mar. 25, 1987

[30] Foreign Application Priority Data

Apr. 22, 1986 [DE] Fed. Rep. of Germany ....... 3613572

[51] Int. Cl.$^4$ .............................................. H01L 21/20
[52] U.S. Cl. ........................... 437/209; 148/DIG. 54; 148/DIG. 12; 148/33.4; 148/33.5; 156/645; 228/123; 228/124; 228/248; 228/127; 228/263.12; 228/120; 228/121; 357/67; 357/74
[58] Field of Search ............... 148/DIG. 54, DIG. 12, 148/33.4, 33.5; 156/645; 228/123, 124, 248, 127, 263.12, 120, 121; 357/67, 74; 29/589, 590

[56] References Cited

U.S. PATENT DOCUMENTS

| | | | |
|---|---|---|---|
| 2,390,452 | 12/1945 | Mudge | 228/248 |
| 3,479,731 | 11/1969 | Mantel et al. | 228/248 |
| 3,716,347 | 2/1973 | Bergstrom et al. | 228/248 |
| 4,485,961 | 12/1984 | Ekbom et al. | 228/248 |
| 4,574,329 | 3/1986 | Eijkelenkamp et al. | 361/321 |

FOREIGN PATENT DOCUMENTS 3414065 12/1985 Fed. Rep. of Germany.

OTHER PUBLICATIONS

J. Fellinger, W. Baumgartner, Ser. No. 3414065 English Translation of German Patent.

Primary Examiner—Brian E. Hearn
Assistant Examiner—Beverly A. Pawlikowski

[57] ABSTRACT

In order to secure electronic components, and particularly large-area power semiconductors, to a substrate, first a paste formed of metal powder and a solvent is applied in the form of a layer to a contacting layer of the component and/or a contact surface of the substrate. The layer of paste is then dried. When the paste has dried, the component is placed onto the substrate, whereupon the entire arrangement is heated to a relatively low sintering temperature preferably between 180° C. and 250° C., and with simultaneous application of a mechanical pressure of at least 900 N/cm$^2$. A connection which is thus achieved by such a pressure sintering at relatively low sintering temperatures is particularly suitable for securing power semiconductors produced in MOS-technology to a substrate.

22 Claims, 2 Drawing Sheets

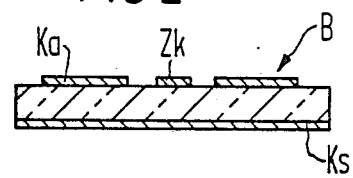
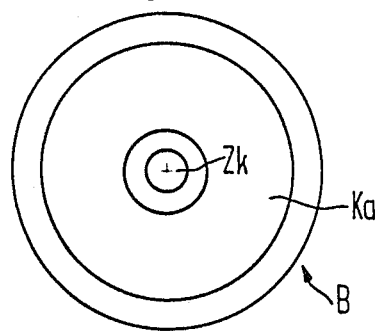
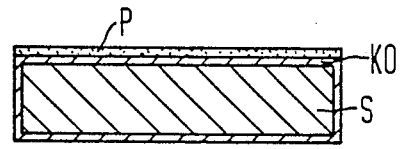
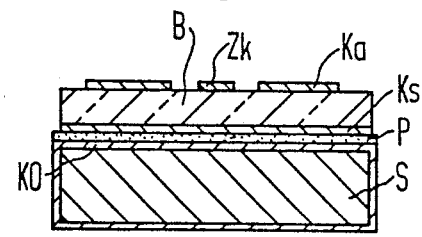

METHOD OF SECURING ELECTRONIC COMPONENTS TO A SUBSTRATE

BACKGROUND OF THE INVENTION

The invention relates to a method of securing electronic components, in particular large-area power semiconductors, to a substrate by pressure sintering. In the conventional production of large-area power semiconductors, such as thyristors and the like, first a substrate formed of molybdenum, a wafer formed of aluminum, and a semiconductor body formed of silicon are joined to one another by heating to approximately 700°–800° C. The connection between the aluminum and the molybdenum can be considered as a type of solder connection, whereas the connection between the aluminum and silicon is achieved by the formation of a eutectic alloy. A simultaneous doping of the silicon takes place during this alloying process. Due to the different heat expansion coefficients of the individual components, the high temperature stress leads to high levels of tension in the power semiconductor, which is manifest in the finished product in the form of corresponding curvatures.

In so-called MOS-technology, during doping and in the formation of the structures, levels of accuracy in the $\mu$m range are facilitated by the use of photo-resist techniques and etching techniques. However, it has not previously been possible to apply MOS-technology to the production of large-area power semiconductors since the high temperatures required for alloying on to a substrate would lead to the destruction of the pn-junctions and of the fine aluminum structures. Neither would it be possible to form the structures following the alloying of the silicon onto the substrate as the existing curvatures would rule out the use of photo-resistant techniques and etching techniques with accuracy levels in the $\mu$m range.

German OS No. 3 414 065, incorporated herein, has already disclosed a method of securing electronic components on a substrate by the use of pressure sintering in which a paste formed of metal powder, preferably silver powder, and a solvent is applied in the form of layers to the contacting layer of the component and/or the contact surface of the substrate;
the component is then placed onto the substrate;
the solvent is completely expelled; and
the entire arrangement is then heated to sintering temperatures of between 380° and 420° C., with the simultaneous application of a mechanical pressure of 80–90 N/cm$^2$.

The use of this known method has permitted small electronic components to be joined to a substrate at a relatively low level of thermal stress and with a high level of mechanical stability. The connecting layers formed by the pressure sintering exhibit extremely small electrical contact resistances and also very small thermal resistances. However, the application of this known method to the securing of large-area power semiconductors to a substrate did not lead to utilizable results. The connecting layers formed by the pressure sintering were always in homogeneous and permeated by channel-like structures which thus resulted in low levels of bonding stability, high electrical contact resistances, and high thermal resistances.

SUMMARY OF THE INVENTION

An object of the present invention is to provide a method of securing electronic components on a substrate by means of pressure sintering. This method is particularly suitable for large area power semiconductors. In particular, the fixing of electronic components produced by MOS-technology to a substrate at a low level of thermal stress is to be facilitated.

This object is achieved by a method of securing electronic components, in particular large-area power semiconductors, to a substrate by means of pressure sintering in which:

a. a paste comprised of metal powder and a solvent is applied in the form of layers to the contacting layer of the component and/or the contact surface of the substrate;
b. the applied paste is then dried;
c. the component is placed onto the substrate; and
d. the entire arrangement is then heated to the sintering temperature, while simultaneously applying a mechanical pressure of at least 900 N/cm$^2$.

The invention is based on the recognition that the paste formed of metal powder and a solvent must be dried before the component is placed onto the substrate as otherwise the solvent vapor lifts off large-area components and escapes to the exterior via a system of channels which form in the paste. On the other hand, the preliminary drying of the paste leads to relatively rough surfaces in the contacting zone, although this disadvantage can be compensated by increasing the mechanical pressure applied during the pressure sintering to at least 900 N/cm$^2$. Surprisingly, it has been determined that even in the pressure sintering of power semiconductors produced in MOS-technology, pressures of this level and even much higher pressures do not result in damage to the fine structure.

In accordance with a preferred embodiment of the invention, the metal powder is formed of the powder of a noble metal or a noble metal alloy. The connecting layers then exhibit particularly low electrical contact resistances. Here it is particularly favorable for the metal powder to be formed of silver powder from the powder of a silver alloy.

In accordance with a further development of the invention, a mechanical pressure of at least 1000 N/cm$^2$ is applied during the pressure sintering. A further increase in the quality of the connection is achieved if a mechanical pressure of at least 1500 N/cm$^2$ is applied in the pressure sintering. It has proven advantageous to carry out the pressure sintering at a mechanical pressure which corresponds at least to the given operating pressure of a pressure-contacted component.

Mechanical stresses resulting from the connection of component and substrate can be further reduced in that prior to the pressure sintering, the component and the substrate are heated in pressure-free fashion to a temperature which is below the sintering temperature and which amounts to at least 100° C. An embodiment which is largely stress-free in operation is finally achieved by heating the component and the substrate in pressure-free fashion to a temperature which corresponds approximately to the given operation temperature of a component.

In order to achieve a particularly low thermal stress, the pressure sintering can be carried out already at a sintering temperature of at least 150° C. However, even better connections are achieved if the pressure sintering is carried out at a sintering temperature of between 180° C. and 250° C. Sintering temperatures of 250° C. and less are particularly favorable if the components are irradiated with electrons or protons in order to influence their carrier lifetime, since higher temperatures would counteract the effect of this irradiation.

In accordance with a further preferred embodiment of the method corresponding to the invention, the pressure sintering is carried out in a press using heated rams. The heating to sintering temperature accompanied by the simultaneous application of the necessary mechanical pressure is then particularly simple, and this embodiment is especially suitable for mass production. When a press of this kind is used, the upper surface of the component can be protected by a deformable intermediate layer during the pressure sintering. In addition, a second intermediate layer formed of a hard material which has a low thermal expansion coefficient can be arranged above the first intermediate layer during the sintering. The second rigid intermediate layer then ensures that heat expansion of the ram is not transferred to the component or its fine structures.

Experiments have indicated that a further substantial increase in the mechanical stability of the connection can be achieved if the pressure sintering is followed by a pressure-free re-sintering. As a result of this pressure-free re-sintering, which can also be referred to as tempering, the sintering times in the press can be reduced, and thus, in the case of mass production, improved cycle times can be achieved. Here it has proven advantageous to use sintering times in a range around one minute for the pressure sintering, and sintering times in a range of several minutes for the re-sintering.

An exemplary embodiment of the invention is represented in the drawing and will be described in detail in the following.

To clarify the layer structure, the layer thicknesses of individual intermediate layers have been greatly exaggerated in contrast to standard scale.

BRIEF DESCRIPTION OF THE DRAWINGS

FIG. 1 is a cross-sectional diagram of a substrate;

FIG. 2 is a cross-sectional diagram of a large-area power semiconductor;

FIG. 3 is a plan view of the power semiconductor shown in FIG. 2;

FIG. 4 illustrates the application of a paste to the substrate corresponding to FIG. 1;

FIG. 5 illustrates the positioning of the power semiconductor, as shown in FIGS. 2 and 3, onto the substrate corresponding to FIG. 4.

DESCRIPTION OF THE PREFERRED EMBODIMENTS

Figure 6:
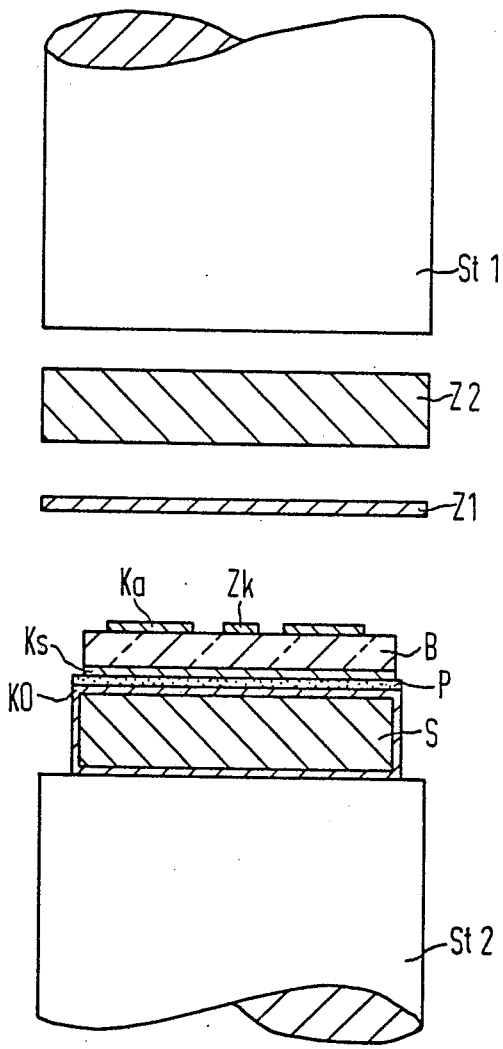
FIG. 6 represents the arrangement shown in FIG. 5 during pressure sintering in a press.

FIG. 1 is a section through a substrate S which has a surrounding contact surface KO. The substrate S is formed, for example, of a 1.5 mm thick wafer of molybdenum with a diameter of 29.6 mm. The contact surface KO which is applied by electroplating, has a thickness of approximately 2 to 3 $\mu$m, and is formed of silver.

FIGS. 2 and 3 represent a cross-sectional and plan view of an electronic component B. This component B is a large-area thyristor, on the surface of which an ignition contact Zk and a cathode Ka can be seen as aluminum structures. On the underneath of the silicon body is arranged a layer sequence which is formed of an approximately 1 $\mu$m thick aluminum layer, an approximately 100 nm thick titanium layer, an approximately 500 nm thick middle layer, and an approximately 200 nm thick silver layer. Only the silver layer which serves as contact surface Ks can be seen from the drawing.

In accordance with FIG. 4, a paste P is applied in the form of layers to the contact surface KO of the substrate S. Screen printing is used to apply the paste P in a layer thickness of between 10 and 100 $\mu$m, preferably approximately 20 $\mu$m. The starting substrate used to produce the paste P is silver powder formed of plate-like powder particles, with a granule size = 15 $\mu$m, and a bulk density of approximately 1.9 g/ml. This silver powder is then suspended in cyclohexanol as solvent in a weight ratio of approximately 2:1. The paste P, which has been produced in this way and which can be screen printed, is then degassed in a vacuum in order to prevent later cavitation during drying and sintering.

Following the application of the paste P, this is fully dried by expelling the solvent. At room temperature the drying time amounts to approximately 30 minutes and at a higher temperature amounts to only a few minutes.

Following the drying of the paste P, the substrate S and the component B are together or separately heated to a temperature which amounts to at least 100° C, but is still below the sintering temperature. This pressure-free heating can also be carried out in a press, as will be described later in the description.

At the latest following the pre-heating, in accordance with FIG. 5 the contacting layer KS of the component B is then placed onto the fully dried paste P of the substrate S. The entire arrangement is then inserted into a press, of which the upper ram St1 and the lower ram St2 can be seen in FIG. 6. Between the top of the component B and the underneath of the upper ram St2, an approximately 80 $\mu$m thick first intermediate layer Z1 formed of aluminum and a very stiff, approximately 1.5 mm thick intermediate layer Z2 formed of molybdenum are arranged consecutively. For clarity, the arrangement of these components has been shown in an exploded view in FIG. 6.

The two rams St1 and St2 of the press are heated in such a manner that the desired sintering temperature is reached in the structure which lies between them. This sintering temperature, which amounts for example to 230° C., is then maintained for approximately one minute and a mechanical pressure of 1500 N/cm$^2$ is simultaneously applied to the entire arrangement by means of the rams St1 and St2. However, it should be expressly noted that even at sintering times of a few seconds, good results can be achieved and that the mechanical pressure can be increased where necessary to 1-2 tons per cm$^2$. It should also be emphasized that the pressure sintering is carried out in a normal atmosphere, i.e. the use of shield gas or forming gas is unnecessary.

On the completion of the pressure sintering, the entire arrangement is removed from the press and is re-sintered in order to further increase the mechanical stability of the connection. This pressure-free re-sintering, which could also be referred to as tempering, is carried out, for example, at a temperature of approximately 250° C., and even a duration of five minutes leads to a substantial improvement in the mechanical stability.

In the above-described production of a thyristor, the connection between the semiconductor body and the substrate is produced by pressure sintering, in which the sintering process is to be entirely of a solid body reaction with no liquid phases. The described method is particularly suitable for large-area power semiconductors produced in MOS-technology, although considerable advantages can also be achieved in the production of other electronic components.

Although various minor changes and modifications might be proposed by those skilled in the art, it will be understood that I wish to include within the claims of the patent warranted hereon all such changes and modifications as reasonably come within my contribution to the art.

I claim as my invention:

1. A method of securing an electronic component having a contacting layer to a contacting surface of a substrate by pressure sintering, comprising steps of:
   applying a layer of a paste formed of metal powder and a solvent onto at least one of said contacting layers of the component and the contacting surface of the substrate;
   fully drying the applied paste;
   placing the component onto the substrate to form an assembly after the applied paste is fully dried; and
   heating the assembly to a sintering temperature with simultaneous application of a mechanical pressure of at least 900 N/cm$^2$ so as to perform said pressure sintering.

2. A method according to claim 1 wherein a powder of a noble metal is used as said metal powder.

3. A method according to claim 1 wherein a powder of a noble metal alloy is used as said metal powder.

4. A method according to claim 2 wherein silver powder is used as said metal powder.

5. A method according to claim 3 wherein a powder of a silver alloy is used as said metal powder.

6. A method according to claim 1 wherein said mechanical pressure is at least 1000 N/cm$^2$ during the pressure sintering.

7. A method according to claim 1 wherein said mechanical pressure is at least 1500 N/cm$^2$ during the pressure sintering.

8. A method according to claim 1 wherein said mechanical pressure corresponds at least to a given operating pressure of the pressure-contacted component during said pressure sintering.

9. A method according to claim 1 wherein prior to the pressure sintering, the component and the substrate are heated in pressure-free fashion to a temperature which is below the sintering temperature, and which is at least 100° C.

10. A method according to claim 9 wherein the component and the substrate are heated in pressure-free fashion to a temperature which corresponds approximately to a given operating temperature of the component.

11. A method according to claim 1 wherein the pressure sintering is carried out at a sintering temperature of at least 150° C.

12. A method according to claim 1 wherein the pressure sintering is carried out at a sintering temperature of between 180° C. and 250° C.

13. A method according to claim 1 wherein the pressure sintering is carried out in a press in which heated rams are applied to the assembly.

14. A method according to claim 1 wherein during the pressure sintering a top of the component is protected by a deformable intermediate layer.

15. A method according to claim 14 wherein during the pressure sintering a second intermediate layer formed of a hard material which has a low heat expansion coefficient is arranged above the intermediate layer.

16. A method according to claim 1 wherein the pressure sintering is followed by a pressure-free re-sintering.

17. A method according to claim 16 wherein sintering times of approximately one minute are selected for the pressure sintering, and sintering times in a range of several minutes are selected for the re-sintering.

18. A method according to claim 1 wherein the electronic component is a large-area power thyristor.

19. A method according to claim 18 wherein said substrate is molybdenum, said contacting surface comprises silver, and said contacting layer comprises silver.

20. A method of securing a semiconductor wafer having an electrically conductive contacting layer to an electrically conductive contacting surface of a substrate by pressure sintering, comprising steps of:
   applying a layer of a paste formed of metal powder and a solvent onto at least one of said contacting layer of the wafer and the contacting surface of the substrate;
   substantially completely drying the applied paste to fully drive out the solvent;
   placing the wafer onto the substrate after the applied paste is substantially fully dried to form an assembly; and
   heating the assembly to a sintering temperature and applying a mechanical pressure of at least 900 N/cm$^2$ during the heating so as to perform said pressure sintering.

21. A method according to claim 20 wherein said semiconductor wafer comprises a large-area power semiconductor.

22. A method according to claim 20 wherein the sintering temperature is less than 250° C.

* * * * *